US010212842B1

(12) United States Patent
Schulze et al.

(10) Patent No.: US 10,212,842 B1
(45) Date of Patent: Feb. 19, 2019

(54) SERVER CHASSIS FOR SERVERS

(71) Applicant: HEWLETT PACKARD ENTERPRISE DEVELOPMENT LP, Houston, TX (US)

(72) Inventors: James Jeffrey Schulze, Houston, TX (US); Troy Anthony Della Fiora, Spring, TX (US); Daniel W. Tower, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/966,549

(22) Filed: Apr. 30, 2018

(51) Int. Cl.
*H05K 7/14* (2006.01)

(52) U.S. Cl.
CPC ......... *H05K 7/1489* (2013.01); *H05K 7/1452* (2013.01)

(58) Field of Classification Search
CPC combination set(s) only.
See application file for complete search history.

(56) References Cited

U.S. PATENT DOCUMENTS

| | | | | |
|---|---|---|---|---|
| 5,460,441 | A * | 10/1995 | Hastings | G06F 1/184 312/138.1 |
| 6,525,930 | B1 * | 2/2003 | Rumney | G06F 1/181 361/679.32 |
| 7,256,995 | B2 * | 8/2007 | Wrycraft | H05K 7/1488 361/695 |
| 7,738,242 | B2 * | 6/2010 | McGraw | G06F 1/18 312/223.1 |
| 8,369,092 | B2 * | 2/2013 | Atkins | G06F 1/187 361/727 |
| 8,797,732 | B2 * | 8/2014 | Ganta Papa Rao Bala | G11B 33/128 361/679.32 |
| 9,538,684 | B2 * | 1/2017 | Chen | H05K 7/1489 |
| 9,706,678 | B1 * | 7/2017 | Chen | H05K 7/1489 |
| 9,736,961 | B2 * | 8/2017 | Conn | H05K 7/1485 |
| 9,781,857 | B2 * | 10/2017 | Jau | G06F 1/183 |
| 9,807,902 | B2 * | 10/2017 | Conn | H05K 7/1489 |
| 10,076,053 | B2 * | 9/2018 | Genest | H05K 7/1487 |
| 2006/0023422 | A1 * | 2/2006 | Shum | H05K 7/20581 361/695 |

(Continued)

OTHER PUBLICATIONS http://www.wiredzone.com/supermicro-racks-kvm-chassis-power-server-chassis-4u-rackmount-cse-946ed-r2kjbod-10024922.
http://www.3d-systems.co.uk/supermicro-superstorage-sc946ed-r2kjbod-chassis/.

*Primary Examiner* — Lisa Lea-Edmonds
(74) *Attorney, Agent, or Firm* — Nolte Intellectual Property Law Group

(57) ABSTRACT

A server chassis installable in a server rack may include a lower compartment, an upper compartment, and an interconnector. The lower compartment may have a front end defining a front opening configured to allow for the passage of a server therethrough. The upper compartment may define a top opening substantially orthogonal to the front opening and may be configured to allow for the passage of a plurality of storage cartridges therethrough. The interconnector may have a first set of connectors communicatively coupled with a second set of connectors. The first set of connectors may be configured to mate with the server, and the second set of connectors may be configured to mate with the storage cartridges, such that the interconnector allows for the removal of the server without the removal of the storage cartridges.

20 Claims, 6 Drawing Sheets

(56) References Cited

U.S. PATENT DOCUMENTS

| | | | | |
|---|---|---|---|---|
| 2008/0310097 A1* | 12/2008 | Sherrod | ............... | H05K 7/1488 |
| | | | | 361/679.4 |
| 2009/0257191 A1* | 10/2009 | Ecker | ................. | H05K 7/20736 |
| | | | | 361/690 |
| 2014/0055934 A1* | 2/2014 | Wu | ...................... | H05K 7/1489 |
| | | | | 361/679.02 |

* cited by examiner

SERVER CHASSIS FOR SERVERS

BACKGROUND

Computer modules, such as servers, are often installed in cabinets or racks, commonly referred to as server racks. In addition, other electronic components, such as power supplies and storage devices are installed in the server racks and are connected to the computer modules via a plurality of cables. Server racks allow for the housing of multiple computer modules and related equipment in a relatively small space. Like other electronic systems, rack-mounted servers include internal components that may be subject to repair, replacement, or upgrade.

BRIEF DESCRIPTION OF THE DRAWINGS

The present disclosure is best understood from the following detailed description when read with the accompanying Figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
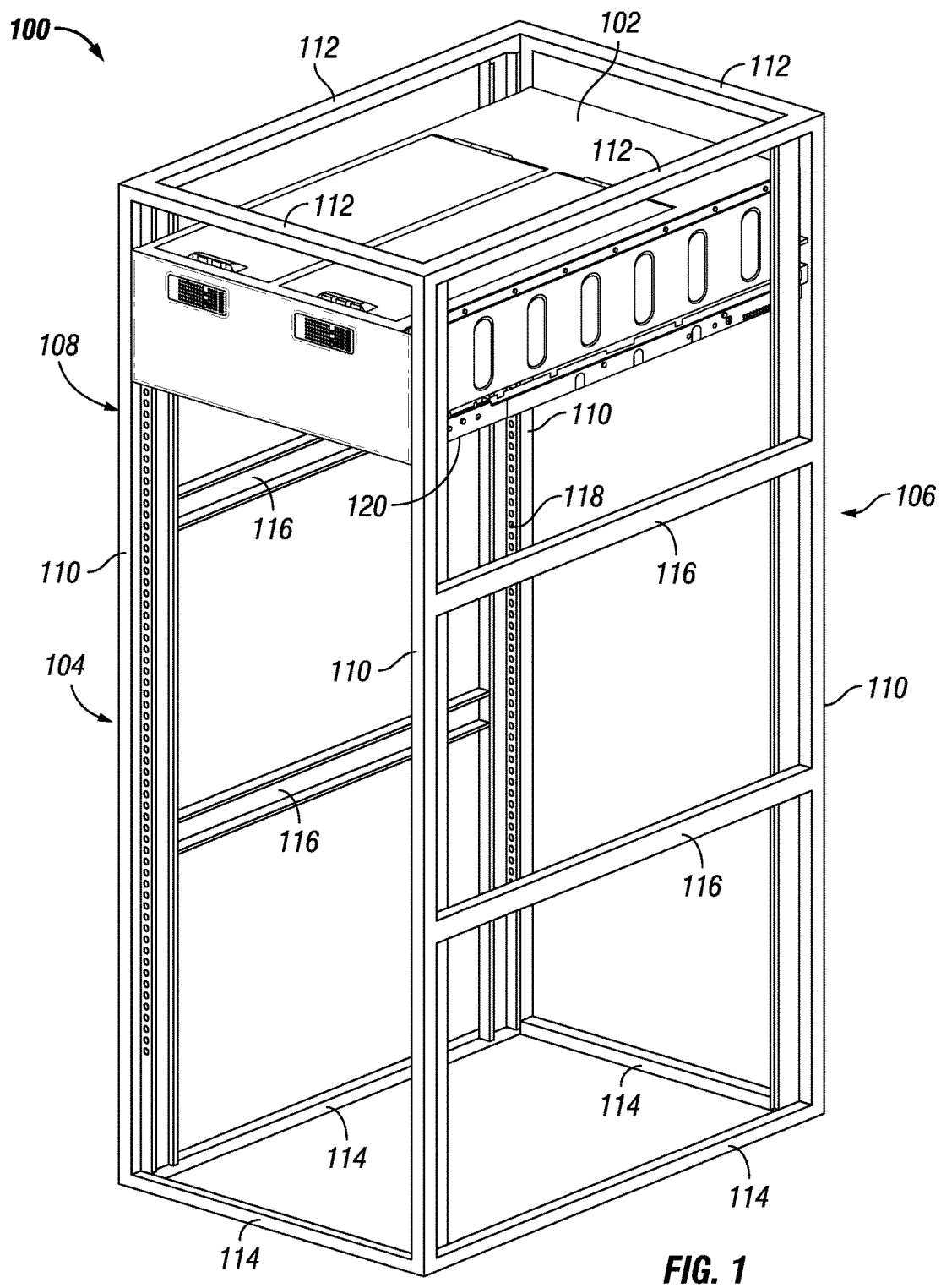
FIG. 1 illustrates a front perspective view of an example server rack, according to one or more embodiments of the disclosure.

Illustrative embodiments of the subject matter claimed below will now be disclosed. In the interest of clarity, not all features of an actual implementation are described in this specification. It will be appreciated that in the development of any such actual embodiment, numerous implementation-specific decisions may be made to achieve the developers' specific goals, such as compliance with system-related and business-related constraints, which will vary from one implementation to another. Moreover, it will be appreciated that such a development effort, even if complex and time-consuming, would be a routine undertaking for those of ordinary skill in the art having the benefit of this disclosure.

Further, as used herein, the article "a" is intended to have its ordinary meaning in the patent arts, namely "one or more." Herein, the term "about" when applied to a value generally means within the tolerance range of the equipment used to produce the value, or in some examples, means plus or minus 10%, or plus or minus 5%, or plus or minus 1%, unless otherwise expressly specified. Further, herein the term "substantially" as used herein means a majority, or almost all, or all, or an amount with a range of about 51% to about 100%, for example. Moreover, examples herein are intended to be illustrative only and are presented for discussion purposes and not by way of limitation.

Data processing includes the collection and manipulation of data to produce meaningful information. Data processing can be accomplished by a single server, multiple servers arranged in a server rack, and multiple server racks in a data processing center, and so forth. One or more servers may be communicatively coupled to a plurality of storage devices, such as hard disk drives (HDDs) and/or solid state drives (SSDs), in a server chassis installed in a server rack.

Generally, advancements in storage devices, such as HDDs, occur at a slower rate than advancements in server technology. Accordingly, there is often a desire to upgrade one or more servers before the removal and replacement of the HDDs communicatively coupled to the server(s). In such instances, the cable connections between the server(s) and the HDDs are removed and the server rack rebuilt with the newly upgraded server(s), which often results in significant interruption to the operations assigned to the server(s).

Embodiments of the present disclosure are directed to a server chassis that allows for the upgrade of at least one server via the removal and replacement of the at least one server without the disconnection or removal from the server chassis of any storage devices communicatively coupled to the at least one server. An interconnector may communicatively couple the at least one server and the storage cartridges without the involvement of cabling that in designs to date results in service operation interruptions occurring from tearing down and rebuilding the cabling connections between the server and storage cartridges while upgrading the server in the server chassis. Additionally, the interconnector may provide a standard interface for the upgrading of servers, resulting in efficient and facile replacement of servers resulting from advancements in server technology.

Particularly, in one embodiment of the present disclosure, a server chassis installable in a server rack may include a lower compartment, an upper compartment, and an interconnector. The lower compartment may have a front end and a rear end. The front end may define a front opening configured to allow for the passage of at least one server therethrough. The upper compartment may define a top opening substantially orthogonal to the front opening and configured to allow for the passage of a plurality of storage cartridges therethrough. The interconnector may have a first set of connectors communicatively coupled with a second set of connectors. The first set of connectors may be configured to mate with the at least one server, and the second set of connectors may be configured to mate with the plurality of storage cartridges, such that the interconnector allows for the removal of the at least one server without the removal of the plurality of storage cartridges.

In another embodiment of the present disclosure, a server chassis installable in a server rack includes a housing, a lower compartment, an upper compartment, and an interconnector. The housing may include a front end, a rear end, and a plurality of panels including a top panel, a bottom panel and a plurality of side panels. The top panel of the housing may define a top opening, and the front end of the housing may define a front opening. The lower compartment may be at least partially defined by the housing and configured to receive or remove at least one server via the front opening. The upper compartment may be at least partially defined by the housing and disposed above the lower compartment as installed in the server rack. The upper compartment may be configured to receive a plurality of server cartridges via the top opening and to retain the server cartridges in a vertical orientation as installed in the upper compartment. The interconnector may be disposed within the housing and spaced from the front end and the rear end of the housing. The interconnector may have a first set of connectors communicatively coupled with a second set of connectors. The first set of connectors may face the front opening and may be configured to mate with the at least one server, and the second set of connectors may face the top opening and may be configured to mate with the plurality of storage cartridges, such that the interconnector allows for the removal of the at least one server without the removal of the plurality of storage cartridges.

In another embodiment of the present disclosure, a method is provided for replacing a server in a server rack. The method may include locating the server in a server chassis mounted to the server rack. The server chassis may include a lower compartment having a front end and a rear end, and the front end may define a front opening. The method may also include disconnecting the server from a first set of connectors of an interconnector. The interconnector may further have a second set of connectors communicatively coupled with the first set of connectors and connected to a plurality of storage cartridges vertically oriented in an upper compartment of the storage chassis. The upper compartment may be disposed on top of the lower compartment. The method may further include removing the server from the lower compartment via the front opening while retaining the connection between the second set of connectors and the plurality of storage cartridges. The method may also include inserting a replacement server into the lower compartment via the front opening while retaining the connection between the second set of connectors and the plurality of storage cartridges. The method may further include connecting the replacement server with the first set of connectors of the interconnector to communicatively couple the replacement server with the plurality of storage cartridges.

Turning now to the Figures, FIG. 1 illustrates a front perspective view of an example server rack 100, according to one or more embodiments of the disclosure. The server rack 100 may be configured as disclosed below to mount and contain therein one or more server chassis 102. Generally, each server chassis 102 may be mounted or otherwise installed from the front 104 of the server rack 100; however, in some embodiments, one or more of the server chassis 102 may mount from the rear 106 of the server rack 100. The server chassis 102 may be mounted in the server rack 100 in a stacked arrangement, where a plurality of server chassis 102 may be stacked above and below one another (see FIG. 2).

As illustrated in FIG. 1, the server rack 100 may include a frame 108 formed from a plurality of rigid corner posts 110 (four shown) interconnected via a plurality of top and bottom structural supports 112, 114 and a plurality of cross members 116. The width of a space or slot between corner posts 110 in which the server chassis 102 is mounted may be a standard 19 inches (48.26 cm) or 23 inches (58.24 cm), for example. However, the present disclosure is not limited thereto, and, in other embodiments, the server rack 100 may have any other width suitable for mounting a server chassis 102 thereto.

An example unit for measuring the height of a server rack is a rack unit, referred to as a "U," which equals about 1.75 inches (4.45 cm). Accordingly, the overall height of the server rack 100 may be measured in units of U, such as, for example, "21 U" or "42 U." Similarly, the height of the server chassis 102 mounted to the server rack 100 may be measured in units of U, such as, for example, 1 U, 2 U, 3 U, and so on.

The corner posts 110 may define a plurality of mounting holes 118 (two indicated) arranged to facilitate the mounting of the server chassis 102 to the server rack 100. The types of mounting holes 118 may vary based on manufacturer, application, and so forth, and may be in accord with the Electronic Industries Association EIA-310 rack standard. The mounting holes 118 may be unthreaded, round or square, and so forth. In certain embodiments, the mounting holes 118 may be at regular intervals. The mounting holes 118 in the corner posts 110 may be arranged vertically and may be equally-spaced, such that the pattern includes three mounting holes repeating every "U", for example.

Figure 2:
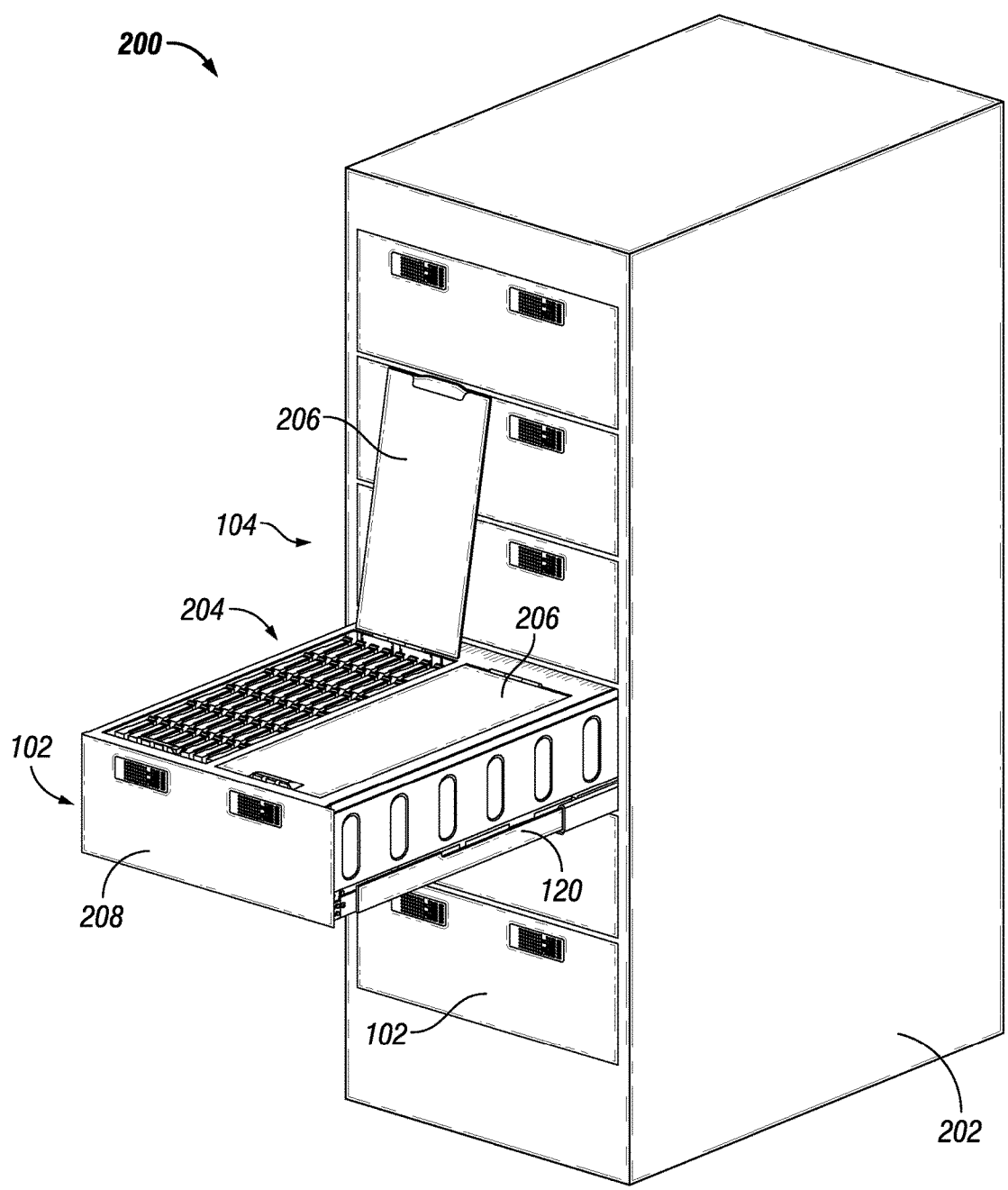
FIG. 2 illustrates a front perspective view of another example server rack, according to one or more embodiments of the disclosure.

Referring now to FIG. 2 with continued reference to FIG. 1, FIG. 2 illustrates a front perspective view of another example server rack 200, according to one or more embodiments of the disclosure. The server rack 200 shown in FIG. 2 is similar to the server rack 100 shown in FIG. 1, and like reference numerals are used to indicate like parts. The server rack 200 may be a cabinet in which case the stack of server chassis 102 (two indicated) may be completely enclosed. To that end, the server rack 200 may include a plurality of side walls 202 (only one indicated in FIG. 2) mounted to a portion of the frame (not shown in FIG. 2). The side walls 202 may be constructed from sheet metal or similar materials. The side walls 202 may have removable panels (not shown) or other openings or ports for accessing the server chassis 102.

Each of the server chassis 102 may be mounted to the server rack 100, 200 via a pair of rack rails 120 (one shown in FIGS. 1 and 2) to allow the server chassis 102 to be slidingly engaged with the server rack 100, 200. Accordingly, as mounted to the server rack 100, 200, the server chassis 102 may be situated in a multitude of positions with respect to the server rack 100, 200. For example, as illustrated in FIG. 1, the server chassis 102 may be positioned in a stored position, where the server chassis 102 is substantially disposed within the server rack 100 and thus does not extend therefrom. The server chassis 102 is generally in the stored position during operation.

In another example, as illustrated in FIG. 2, the server chassis 102 may be positioned in an access position, where the server chassis 102 extends from the front 104 of the server rack 200 to allow access to one or more components 204 of the server chassis 102. The components may be located within the server chassis 102 and accessible by access panels 206 that are at least partially removable in the access position. One or more latches or screws, such as thumbscrews (not shown), may be employed to secure the server chassis 102 to the server rack 200 in a fixed position, such as the stored or access position, and may be manipulated (e.g., depressed or otherwise actuated) to facilitate installation, extension, and/or removal of the server chassis 102 in connection with the server rack 200.

Figure 3:
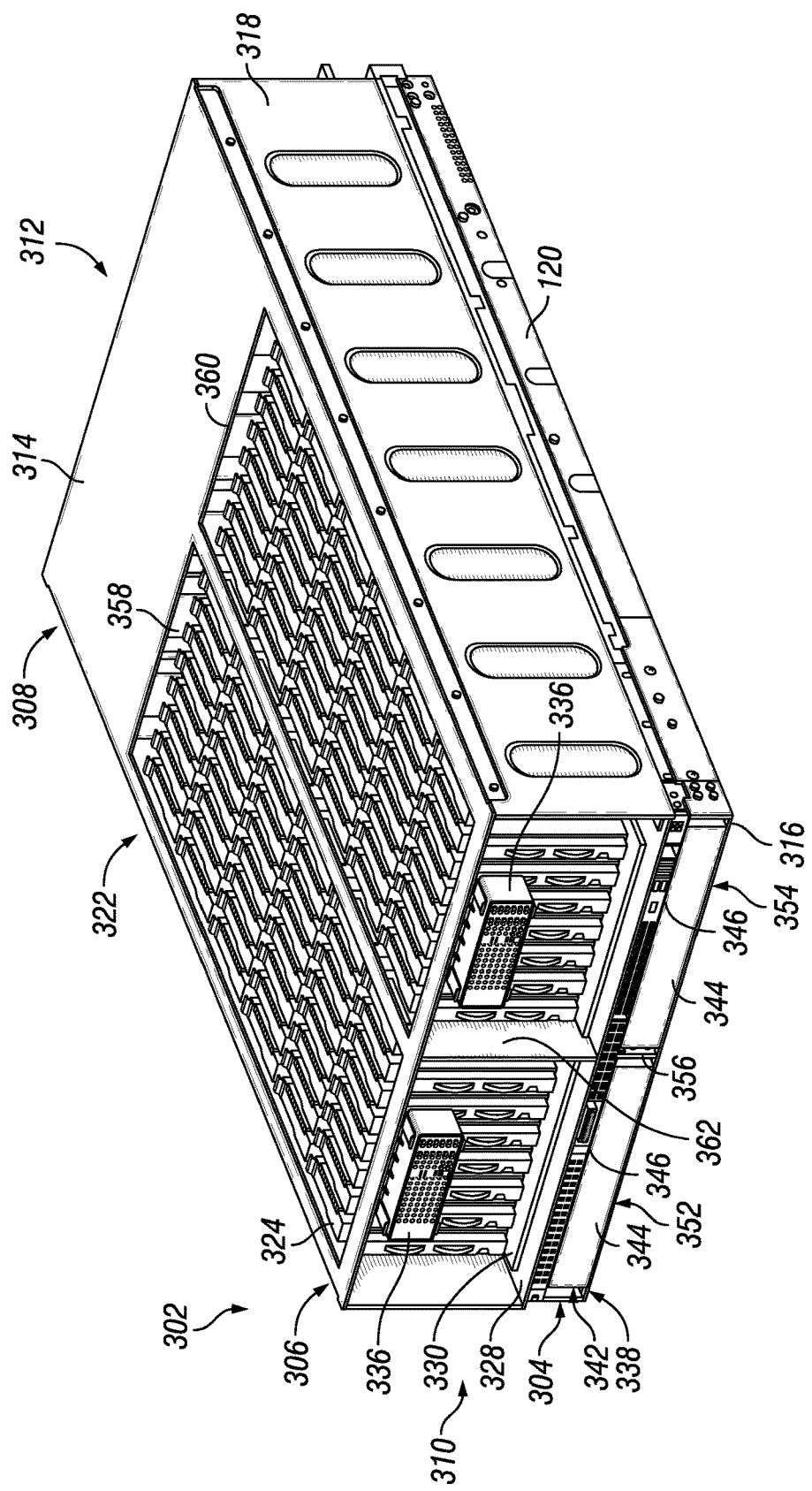
FIG. 3 illustrates a front perspective view of an example server chassis installable in the server rack of FIG. 1 or 2, according to one or more embodiments of the disclosure.
Figure 4:
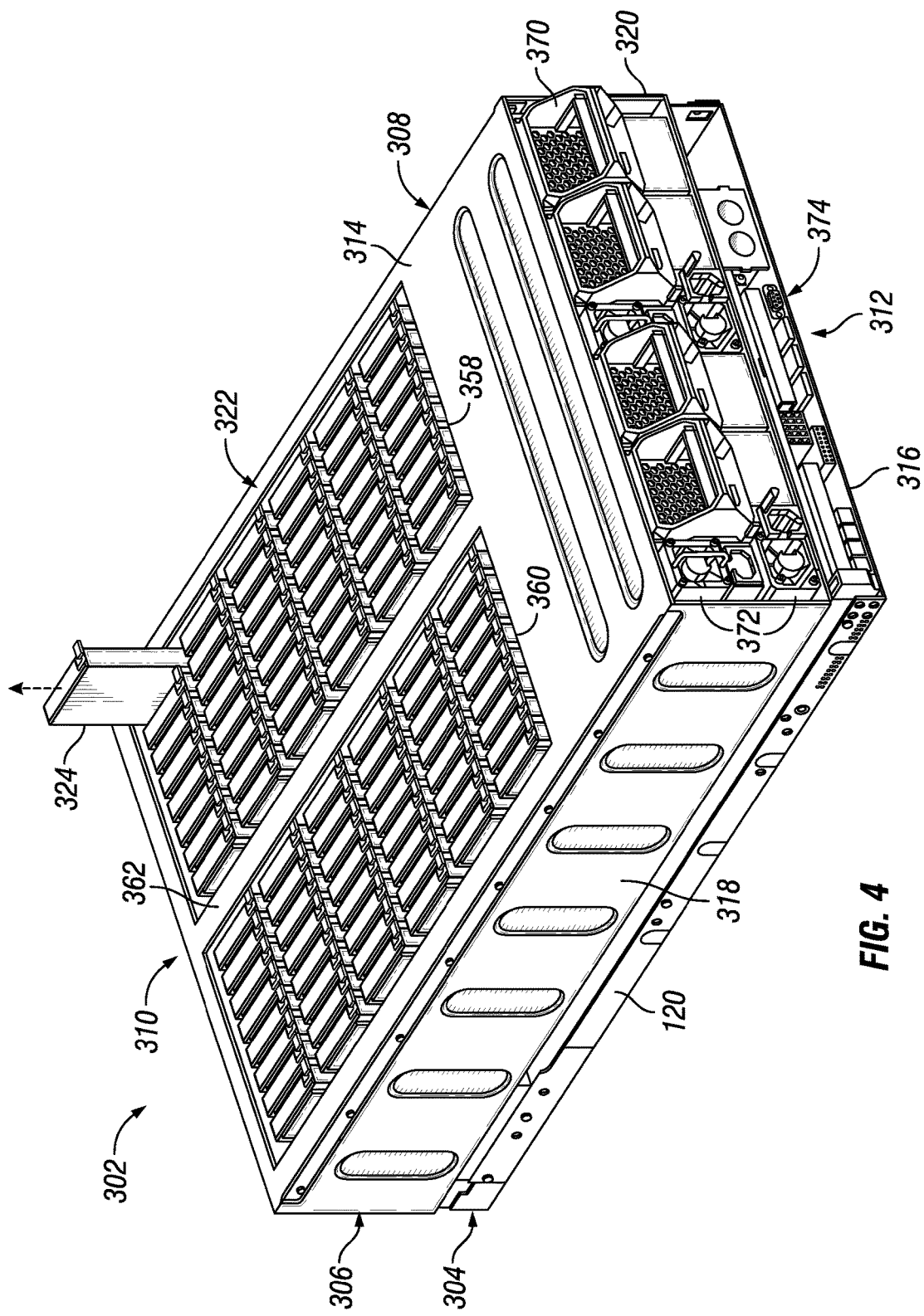
FIG. 4 illustrates a rear perspective view of the server chassis of FIG. 3, according to one or more embodiments of the disclosure.
Figure 5:
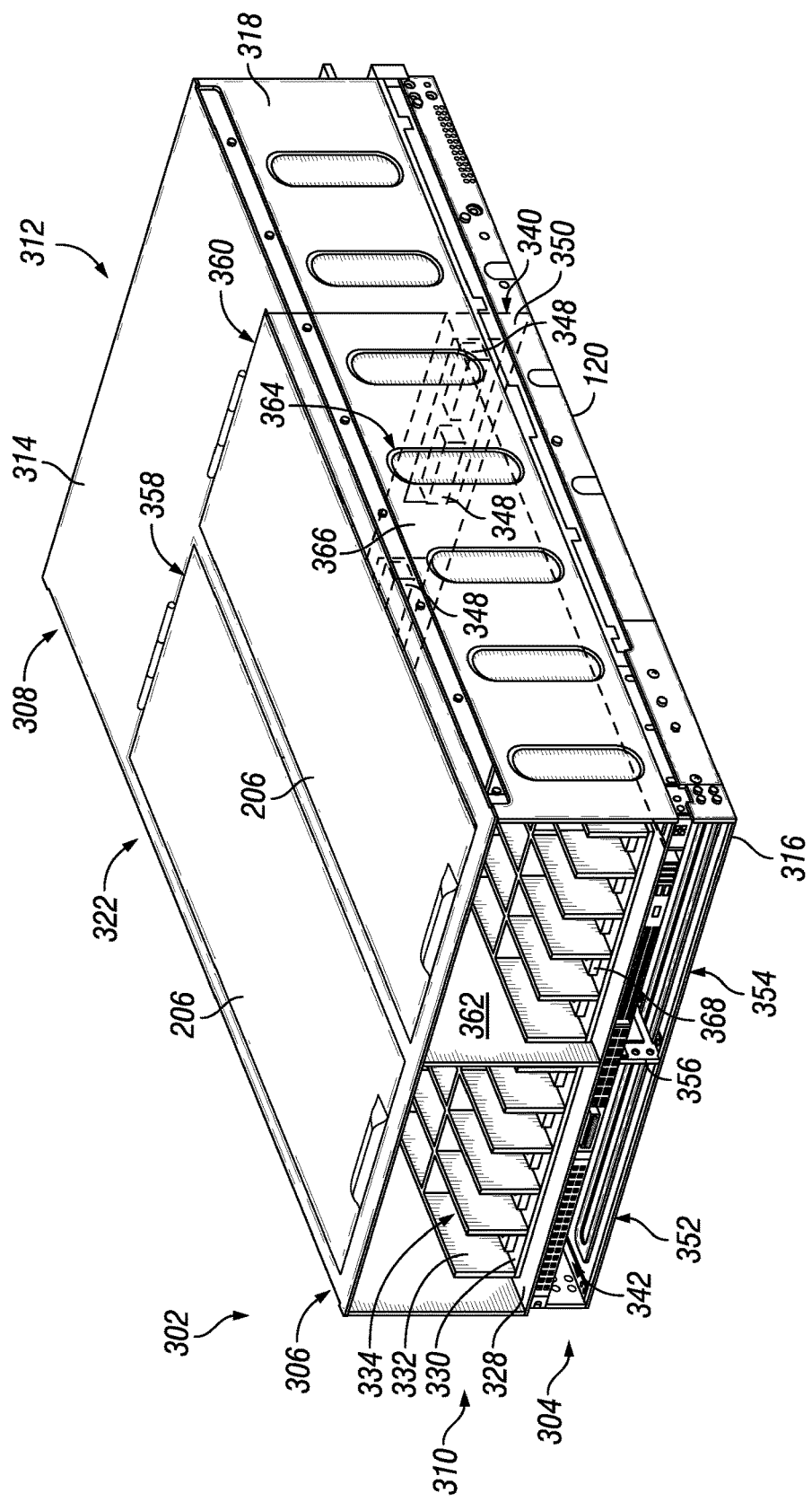
FIG. 5 illustrates a front perspective view of the server chassis of FIG. 3 where the storage cartridges and servers have been removed, according to one or more embodiments of the disclosure.

Referring now to FIGS. 3-5 with continued reference to FIG. 1, FIGS. 3 and 4 illustrate respective front and rear perspective views of an example server chassis 302 installable in either of the server racks 100, 200, according to one or more embodiments of the disclosure. The example server chassis 302 may be the server chassis 102 removed from either of the server racks 100, 200, or may be substantially similar to the server chassis 102 disclosed above and thus may be used in place of or in conjunction with the server chassis 102 in either of the server racks 100, 200. Accordingly, like reference numerals are used to indicate like parts.

The server chassis 302 may be slidably mounted to the server rack 100, 200 via rack rails 120 (one shown) through the front 104 of the server rack 100, 200. In an embodiment in which the server rack 100, 200 is a standard nineteen inches wide between corner posts 110, the server chassis 302 may be about 17¾ (45.09 cm) in width. It will be understood that the foregoing is utilized for illustrative purposes, and the width of the server chassis 302 including the rack rails 120 is dimensioned for mounting in the server rack 100, 200 and thus may vary depending on the width of the server rack 100, 200.

As illustrated in FIGS. 3 and 4, the server chassis 302 includes a lower compartment 304 and an upper compartment 306 disposed on top of the lower cabinet 304 as installed in the server rack 100, 200. The upper compartment 306 and the lower compartment 304 may be enclosed or partially enclosed by a housing 308 including framing and/or a plurality of panels constructed from sheet metal or other suitable material having sufficient structural characteristics. In the illustrated embodiment of FIGS. 3 and 4, the housing 308 may include a front end 310 and a rear end 312, and a top panel 314, a bottom panel 316, a plurality of side panels 318 (one shown) extending between the front end 310 and the rear end 312. The top panel 314, bottom panel 316, and side panels 318 may be interconnected with one another to at least partially define the upper compartment 306 and the lower compartment 304. In one or more embodiments, the housing 308 may further include a front panel 208 (FIG. 2) at the front end 310 of the housing 308 to enclose the upper compartment 306, and a rear panel 320 (FIG. 4) at the rear end 312 of the housing 308.

In one or more embodiments, the top panel 314 may form the top of the upper compartment 306. A portion of the top panel 314 may define a top opening 322 configured to allow access to the upper compartment 306. The top opening 322 may be configured to allow for the passage of a plurality of storage cartridges 324 (only one indicated) therethrough, as shown in FIG. 4. For example, the storage cartridges 324 may be hard disk drives (HDDs). In one or more embodiments, the storage cartridges 324 may be short form factor (SFF) HDDs. In at least one other embodiment, the storage cartridges 324 may be large form factor (LFF) HDDs.

The top opening 322 may be selectably covered by one or more access panels 206 (two shown, see FIG. 5) detachably attached to or forming part of the top panel 314. The access panel(s) 206 may be removed or otherwise manipulated to provide access to the upper compartment 306 from the top of the server chassis 302. For example, an end of each access panel 206 may be pivotally attached to the top panel 314 to allow an opposing end of the access panel 206 to be pivoted away from the top panel 314 to provide access to the upper compartment 306. In another embodiment, the access panel(s) 206 may be slidingly engaged with the top panel 314 to allow the access panel(s) 206 to slide toward the front end 310 of the housing 308 to provide access to the top opening 322.

As shown most clearly in FIG. 3, the housing 308 may further include an intermediate panel 328 disposed between the top panel 314 and the bottom panel 316 and separating the upper compartment 306 and the lower compartment 304. Accordingly, in one or more embodiments, the intermediate panel 328 may form the bottom of the upper compartment 306. In one embodiment, the intermediate panel 328 may be a continuous sheet of metal or other suitable structural material. In another embodiment, the intermediate panel 328 may define one or more intermediate openings (not shown) such that the intermediate panel 328 forms a perimeter frame (not shown) having one or more support members (not shown) extending longitudinally and/or transversely. The intermediate panel 328 may include a plurality of tabs (not shown) or other mounting points. As illustrated in FIG. 3, an upper compartment printed circuit board (PCB) 330, such as a motherboard, may be coupled to and disposed on top of the intermediate panel 328.

FIGS. 3 and 4 illustrate a plurality of the storage cartridges 324 disposed vertically in the upper compartment 306 and coupled to the upper compartment PCB 330. The storage cartridges have been omitted from FIG. 5 for clarity purposes. Accordingly, as shown most clearly in FIG. 5, the upper compartment 306 may include a plurality of dividers, illustrated as interconnected walls 332 (only one indicated), arranged in a grid and defining a plurality of slots 334 (only one indicated), each slot 334 configured to receive a respective storage cartridge 324 of the plurality of storage cartridges. It will be understood that the number of slots 334 defined by the interconnected walls 332 will vary depending at least on the width of the server chassis 302 and the type of storage cartridge 324 utilized therein. For example, as illustrated in FIGS. 3 and 4, the server chassis 302 includes about 96 slots; however, the present disclosure is not limited thereto, and in other embodiments, the number of slots 334 may be greater (e.g., about 120) or fewer.

As shown in FIG. 3, the front end of the housing 308 may include at least one display 336 (two shown), such as an LED display, provided to indicate the status and performance of each of the storage cartridges 324 disposed in the upper compartment 306. In one or more embodiments, the front panel 208 (FIG. 2) of the housing 308 may cover the front end 310 of the housing 308 except for the display 336. In another embodiment, the front panel 208 (FIG. 2) of the housing 308 may be pivotally attached to the front end 310 to selectively cover the display 336. In yet another embodiment, the front panel 208 (FIG. 2) of the housing 308 may cover the front end 310 of the housing 308 except for the display 336 and the lower compartment 304.

As illustrated in FIGS. 3 and 4, the lower compartment 304 has a front end 338 (FIG. 3) and a rear end 340 (FIG. 5). The front end 338 of the lower compartment 304 may correspond to the front end 310 of the housing 308 in some embodiments and may define a front opening 342 orthogonal or substantially orthogonal to the top opening 322 and configured to allow for the passage of at least one server 344 (two shown in FIG. 3) therethrough. As provided herein, the server(s) 344 may be any rack-mounted computer system performing server operations.

In one or more embodiments, the server 344 may be encased in a modular, removable housing 346 called a "blade." These blades 346, in turn, may be installed and removed via the front opening 342 and may be contained within the lower compartment 304 during operation thereof. In one or more embodiments, the blade 346 may have a width substantially similar to the width of the lower compartment 304. Each blade 346 may have at least one connector (not shown) configured to mate with a respective connector 348 (FIG. 5) facing the front opening 342 of the lower compartment 304 and disposed on a lower compartment printed circuit board (PCB) 350 at the rear end 340 of the lower compartment 304.

As illustrated in FIG. 3, the lower compartment 304 is partitioned into a plurality of lower compartment sections 352, 354 (two shown) via a lower compartment divider wall 356. The plurality of lower compartment sections 352, 354 includes a first lower compartment section 352 and the second lower compartment section 354, where each of the first lower compartment section 352 and the second lower compartment section 354 is configured to house a respective server 344. In such embodiments, the respective blades 346 may have a width substantially similar to the half the width of the lower compartment 304.

The lower compartment 304 may be partitioned to house a plurality of servers 344 for redundancy purposes. Accordingly, the upper compartment 306 may be partitioned to contain redundant storage cartridges 324. To that end, the upper compartment 306 may be partitioned as shown in FIGS. 3 and 4 into a first upper compartment section 358 and a second upper compartment section 360 via an upper compartment divider wall 362. Each of the first upper compartment section 358 and the second upper compartment section 360 may be configured to house a respective plurality of storage cartridges 324. In addition, the first upper compartment section 360 may define a first portion of the top opening 322 and the second upper compartment section may define a second portion of the top opening 322, such that respective access panels 206 (FIG. 5) may selectively cover the first and second portions of the top opening 322.

For redundancy purposes, the server 344 disposed in the first lower compartment section 352 may be communicatively coupled to the plurality of storage cartridges 324 in the first upper compartment section 358, and the server 344 disposed in the second lower compartment section 354 may be communicatively coupled to the plurality of storage cartridges 324 in the second upper compartment section 360. Referring now to FIG. 5 with continued reference to FIGS. 3 and 4, FIG. 5 illustrates a front perspective view of the server chassis 302 of FIGS. 3 and 4 where the storage cartridges 324 and the servers 344 have been omitted for clarity purposes, according to one or more embodiments of the disclosure. The server chassis 302 may include an interconnector 364 to communicatively couple the plurality of storage cartridges 324 and the server(s) 344.

The interconnector 364 may include the upper compartment PCB 330 and the lower compartment PCB 350 and may further include a midplane 366 configured to communicatively couple the upper compartment PCB 330 and the lower compartment PCB 350. In one or more embodiments, the midplane 366 may be an orthogonal midplane. The upper compartment PCB 330 may have a set of connectors 368 (only one indicated) facing the top opening 322 of the upper compartment 306 and configured to mate (e.g., pin and socket) with the plurality of storage cartridges 324. The lower compartment PCB 350 may have a set of connectors 348 facing the front opening 342 of the lower compartment 304 and configured to mate (e.g., pin and socket) with the server(s). The midplane 366 may couple the upper compartment PCB 330 and the lower compartment PCB 350 via pin and socket connections, thus resulting in the omission of cables or wires in the interconnection of the plurality of storage cartridges 324 and the server(s) 344. The midplane 366 may be or include a printed circuit board, where each of the connections in the midplane 366 may form a computer bus communicatively coupling the upper compartment PCB 330 and the lower compartment PCB 350.

The interconnector 364 may be partitioned for redundancy in accordance with the partitioned upper compartment 306 and lower compartment 304. Accordingly, a portion of the connectors 368 of the upper compartment PCB 330 corresponding to a plurality of storage cartridges 324 in the first upper compartment section 358 may be communicatively coupled with a portion of the connectors 348 of the lower compartment PCB 350 corresponding to the server 344 in the first lower compartment section 352. Correspondingly, a portion of the connectors 368 of the upper compartment PCB 330 corresponding to a plurality of storage cartridges 324 in the second upper compartment section 360 may be communicatively coupled with a portion of the connectors 348 of the lower compartment PCB 350 corresponding to the server 344 in the second lower compartment section 354.

As cables or wires are omitted in the interconnection of the plurality of storage cartridges 324 and the server(s) 344 in the present disclosure, the replacement of the server(s) 344 for repair or upgrade purposes may take place without the removal or disruption (e.g., cable or wire disconnection) of the plurality of storage cartridges 324, thereby reducing the interruption to the operations assigned to the server(s) 344 being replaced. To the contrary, an upgraded server 344 may be installed in the lower compartment 304 and expeditiously brought online without the conventional integration of cables or wires involving the reconnection or reinstallation of any cabling connections for the storage cartridges 324. The server(s) 344 may be removed and replaced with the server chassis 302 in the stored position (FIG. 1) or the access position (FIG. 2), or in any position therebetween.

As shown most clearly in FIG. 5, the midplane 366 of the interconnector 364 may be disposed adjacent the bottom of the upper compartment 306 and the rear end 340 of the lower compartment 304 and spaced from the rear end 312 of the housing 308. In the illustrated embodiment of FIG. 4, the rear end 312 of the housing 308 may have a plurality of fans 370 (only one indicated), electrical inputs and outputs 374 (collectively "electrical I/Os"—only one indicated), and power supplies 372 mounted to and/or extending therefrom. The plurality of fans 370 may be utilized for controlling temperature, ventilation, cooling, and so forth of the server(s) 344, storage cartridges 324, interconnector 364, and associated electrical components. The power supplies 372 may be utilized to supply electrical energy to components of the server(s) 344 and associated electrical components.

As illustrated in FIGS. 3-5, the height of the server chassis 302 is 4 U. In another embodiment, the height of the server chassis 302 is 5 U. The height of the upper compartment 306 may be 3 U in embodiments utilizing the SFF HDDs. In embodiments utilizing LFF HDDs, the height of the upper compartment 306 may be 4 U. In the illustrated embodiment of FIGS. 3-5, the height of the lower compartment 304 is 1 U.

Figure 6:
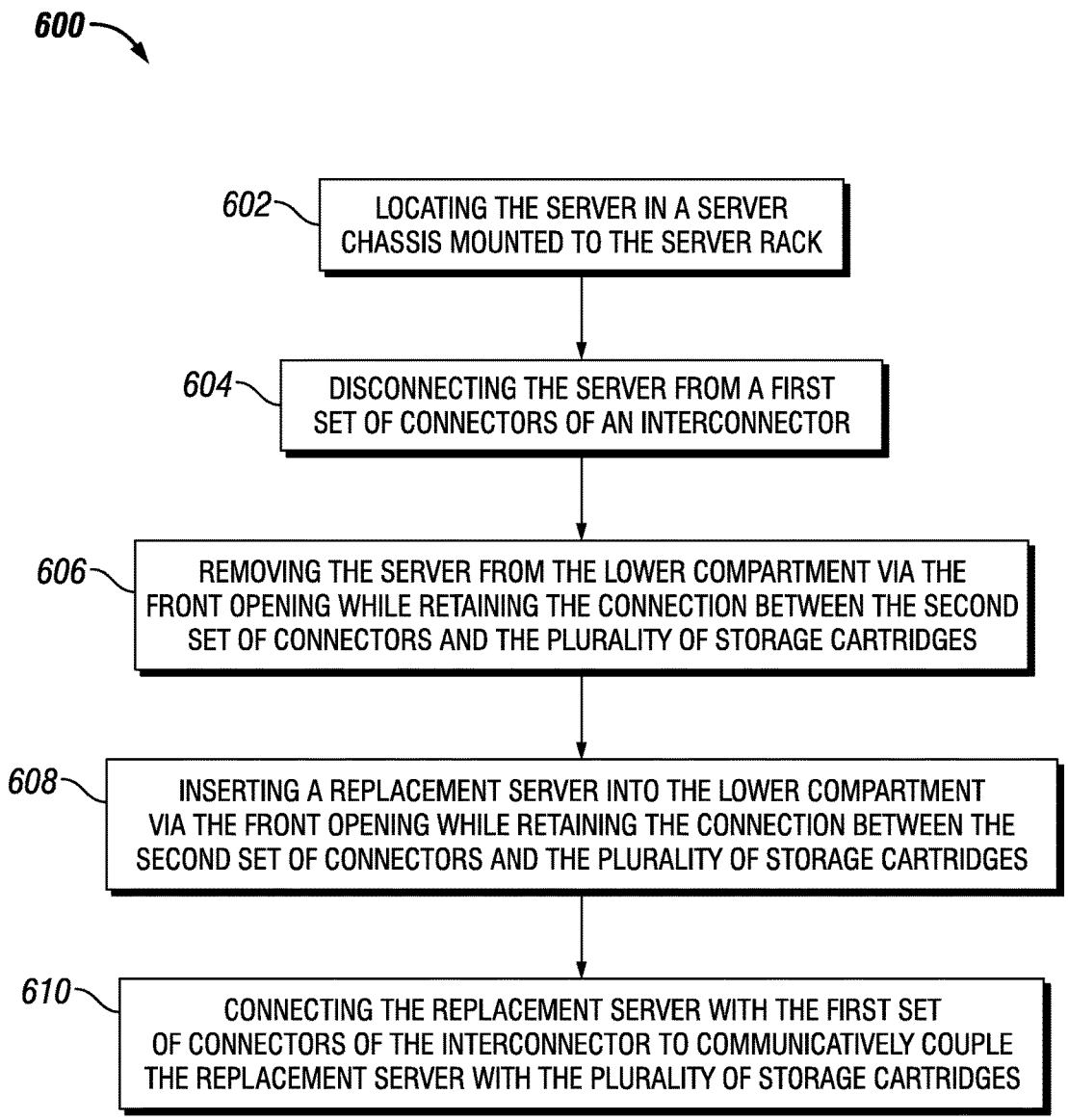
FIG. 6 is a flowchart depicting a method for replacing a server in a server rack, according to one or more embodiments of the disclosure.

Referring now to FIG. 6 with continued reference to FIGS. 1-5, FIG. 6 is a flowchart depicting a method 600 for replacing a server in a server rack, according to one or more embodiments of the disclosure. The method 600 may include locating the server in a server chassis mounted to the server rack, as at 602. The server chassis may include a lower compartment having a front end and a rear end, and the front end may define a front opening. The method 600 may also include disconnecting the server from a first set of connectors of an interconnector, as at 604. The interconnector may further have a second set of connectors communicatively coupled with the first set of connectors and connected to a plurality of storage cartridges vertically oriented in an upper compartment of the storage chassis. The upper compartment may be disposed on top of the lower compartment.

The method 600 may further include removing the server from the lower compartment via the front opening while retaining the connection between the second set of connectors and the plurality of storage cartridges, as at 606. The method 600 may also include inserting a replacement server into the lower compartment via the front opening while retaining the connection between the second set of connectors and the plurality of storage cartridges, as at 608. The method 600 may further include connecting the replacement server with the first set of connectors of the interconnector to communicatively couple the replacement server with the plurality of storage cartridges, as at 610.

In one or more embodiments, the lower compartment may have a height of 1 U, and the upper compartment may have a height of 3 U. The upper compartment may have a top and a bottom, the top defining a top opening configured to allow for the passage of the plurality of storage cartridges therethrough. In at least one embodiment, the first set of connectors of the interconnector may face the front opening and may be axially spaced from a rear end of the server chassis opposing the front opening of the lower compartment.

The foregoing description, for purposes of explanation, used specific nomenclature to provide a thorough understanding of the disclosure. However, it will be apparent to one skilled in the art that the specific details are not required in order to practice the systems and methods described herein. The foregoing descriptions of specific examples are presented for purposes of illustration and description. They are not intended to be exhaustive of or to limit this disclosure to the precise forms described. Obviously, many modifications and variations are possible in view of the above teachings. The examples are shown and described in order to best explain the principles of this disclosure and practical applications, to thereby enable others skilled in the art to best utilize this disclosure and various examples with various modifications as are suited to the particular use contemplated. It is intended that the scope of this disclosure be defined by the claims and their equivalents below.

What is claimed is:

1. A server chassis installable in a server rack, comprising:
    a lower compartment having a front end and a rear end, the front end defining a front opening configured to allow for the passage of at least one server therethrough;
    an upper compartment defining a top opening substantially orthogonal to the front opening and configured to allow for the passage of a plurality of storage cartridges therethrough; and
    an interconnector having a first set of connectors communicatively coupled with a second set of connectors, the first set of connectors configured to mate with the at least one server, and the second set of connectors configured to mate with the plurality of storage cartridges, such that the interconnector allows for the removal of the at least one server without the removal of the plurality of storage cartridges.

2. The server chassis of claim 1, wherein the upper compartment comprises at least one access panel configured to selectively cover at least a portion of the top opening.

3. The server chassis of claim 1, wherein the upper compartment further comprises a plurality of walls arranged in a grid and defining a plurality of slots, each slot configured to receive a respective storage cartridge of the plurality of storage cartridges.

4. The server chassis of claim 1, further comprising a plurality of rack rails coupled to at least one of the upper compartment and the lower compartment and configured to slidingly engage with the server rack.

5. The server chassis of claim 1, wherein the height of the lower compartment is 1 U and the height of the upper compartment is 3 U.

6. The server chassis of claim 1, wherein the height of the lower compartment is 1 U and the height of the upper compartment is 4 U.

7. The server chassis of claim 1, wherein the lower compartment is partitioned into a first lower compartment section and a second lower compartment section, each of the first lower compartment section and the second lower compartment section configured to house a respective server.

8. The server chassis of claim 7, wherein the upper compartment is partitioned into a first upper compartment section defining a first portion of the top opening and a second upper compartment section defining a second portion of the top opening, each of the first upper compartment section and the second upper compartment section configured to house a respective plurality of storage cartridges.

9. The server chassis of claim 8, wherein the upper compartment comprises:
    a first access panel configured to selectively cover the first portion of the top opening of the first upper compartment section; and
    a second access panel configured to selectively cover the second portion of the top opening of the second upper compartment section.

10. A server chassis installable in a server rack, comprising:
    a housing including a front end, a rear end, and a plurality of panels including a top panel, a bottom panel and a plurality of side panels, the top panel of the housing defining a top opening, and the front end of the housing defining a front opening;
    a lower compartment at least partially defined by the housing and configured to receive or remove at least one server via the front opening;
    an upper compartment at least partially defined by the housing and disposed above the lower compartment as installed in the server rack, the upper compartment configured to receive a plurality of server cartridges via the top opening and to retain the server cartridges in a vertical orientation as installed in the upper compartment; and
    an interconnector disposed within the housing and spaced from the front end and the rear end of the housing, the interconnector having a first set of connectors communicatively coupled with a second set of connectors, the first set of connectors facing the front opening and configured to mate with the at least one server, and the second set of connectors facing the top opening and configured to mate with the plurality of storage cartridges, such that the interconnector allows for the removal of the at least one server without the removal of the plurality of storage cartridges.

11. The server chassis of claim 10, wherein the height of the lower compartment is 1 U and the height of the upper compartment is 3 U.

12. The server chassis of claim 10, wherein the height of the lower compartment is 1 U and the height of the upper compartment is 4 U.

13. The server chassis of claim 10, wherein the upper compartment further comprises a plurality of walls arranged in a grid and defining a plurality of slots, each slot configured to receive a respective storage cartridge of the plurality of storage cartridges.

14. The server chassis of claim 10, wherein the plurality of panels includes at least one access panel disposed over at least a portion of the top opening and configured to selectively allow access to the upper compartment.

15. The server chassis of claim 10, wherein the lower compartment is partitioned into a first lower compartment section and a second lower compartment section, each of the first lower compartment section and the second lower compartment section configured to house a respective first server and second server.

16. The server chassis of claim 15, the upper compartment is partitioned into a first upper compartment section and a second upper compartment section, each of the first upper compartment section and the second upper compartment section configured to house a respective first plurality of storage cartridges and second plurality of storage cartridges.

17. The server chassis of claim 16, wherein the interconnector further comprises a third set of connectors communicatively coupled with a fourth set of connectors and configured to operate independently of the first set of connectors and the second set of connectors to provide redundancy, wherein the first set of connectors faces the front opening and is configured to mate with the first server, the second set of connectors faces the top opening and is configured to mate with the first plurality of storage cartridges, the third set of connectors faces the front opening and is configured to mate with the second server, and the fourth set of connectors faces the top opening and is configured to mate with the second plurality of storage cartridges, such that the interconnector allows for the removal of at least one of the first server and the second server without the removal of the first plurality of storage cartridges and the second plurality of storage cartridges.

18. A method for replacing a server in a server rack, comprising:
locating the server in a server chassis mounted to the server rack, the server chassis comprising a lower compartment having a front end and a rear end, the front end defining a front opening;
disconnecting the server from a first set of connectors of an interconnector, the interconnector further having a second set of connectors communicatively coupled with the first set of connectors and connected to a plurality of storage cartridges vertically oriented in an upper compartment of the storage chassis, the upper compartment disposed on top of the lower compartment;
removing the server from the lower compartment via the front opening while retaining the connection between the second set of connectors and the plurality of storage cartridges;
inserting a replacement server into the lower compartment via the front opening while retaining the connection between the second set of connectors and the plurality of storage cartridges; and
connecting the replacement server with the first set of connectors of the interconnector to communicatively couple the replacement server with the plurality of storage cartridges.

19. The method of claim 18, wherein:
the lower compartment has a height of 1 U; and
the upper compartment has a top and a bottom, the top defines a top opening configured to allow for the passage of the plurality of storage cartridges therethrough; and
the upper compartment has a height of 3 U.

20. The method of claim 18, wherein the first set of connectors of the interconnector faces the front opening and are axially spaced from a rear end of the server chassis opposing the front opening of the lower compartment.

* * * * *